US006535422B2

(12) United States Patent
Goto et al.

(10) Patent No.: US 6,535,422 B2
(45) Date of Patent: Mar. 18, 2003

(54) NONVOLATILE MEMORY SYSTEM

(75) Inventors: Hiroyuki Goto, Higashimurayama (JP); Shigemasa Shiota, Tachikawa (JP); Takayuki Tamura, Higashiyamato (JP); Hirofumi Shibuya, Higashimurayama (JP); Yasuhiro Nakamura, Tachikawa (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/023,882

(22) Filed: Dec. 21, 2001

(65) Prior Publication Data

US 2002/0085418 A1 Jul. 4, 2002

(30) Foreign Application Priority Data

Dec. 28, 2000 (JP) .................................... 2000-402543

(51) Int. Cl.[7] .............................................. G11C 16/04

(52) U.S. Cl. ............................ 365/185.11; 365/185.17; 365/185.33; 365/52

(58) Field of Search ...................... 365/185.09, 185.11, 365/185.17, 185.33, 233, 52

(56) References Cited

U.S. PATENT DOCUMENTS

| | | | | | |
|---|---|---|---|---|---|
| 5,621,685 | A | * | 4/1997 | Cernea et al. | 365/185.33 |
| 5,646,904 | A | * | 7/1997 | Ohno et al. | 365/233 |
| 5,822,251 | A | * | 10/1998 | Bruce et al. | 365/185.33 |
| 5,844,910 | A | * | 12/1998 | Niijima et al. | 365/185.11 |
| 6,148,363 | A | * | 11/2000 | Lofgren et al. | 365/185.33 |
| 6,252,791 | B1 | * | 6/2001 | Wallace et al. | 365/185.33 |
| 6,260,132 | B1 | * | 7/2001 | Buer | 365/185.17 |
| 6,381,175 | B2 | * | 4/2002 | Pitts | 365/185.11 |

FOREIGN PATENT DOCUMENTS

JP 11-273370 3/1998

* cited by examiner

*Primary Examiner*—Trong Phan

(57) ABSTRACT

The present invention provides a nonvolatile memory system whose storage capacity can be easily changed. The nonvolatile memory system comprises plural memory modules, a controller for controlling the operation of the plural memory modules according to access requests from the outside, and a module selecting decoder for selectively enabling the memory modules by decoding a selection signal outputted from the controller, wherein the memory modules are freely mounted or dismounted. With this arrangement, the storage capacity can be changed by increasing or decreasing the memory modules.

13 Claims, 9 Drawing Sheets

NONVOLATILE MEMORY SYSTEM

BACKGROUND OF THE INVENTION

The present invention relates to a nonvolatile memory system, and more particularly to a technique effectively applied to a flash memory system that has electrically erasable and programmable flash memories.

Flash memories are nonvolatile semiconductor memories that can store information by injection and ejection of electrons to and from floating gates. The flash memories have a memory cell transistor comprising a floating gate, control gate, source, and drain. The memory cell transistor rises in threshold voltage when electrons are injected to the floating gate, and falls in threshold voltage when electrons are ejected from the floating gate. The memory cell transistor stores information according to a rise or fall in threshold voltage to a word line voltage (control gate applied voltage) for data reading. Although not specially limited, in this specification, a low threshold voltage state of a memory transistor is referred to as erasure state, and a high threshold voltage state thereof is referred to as write state.

Memory modules in which plural such flash memories are provided and a data bus and address bus are used in common include an IC memory disclosed in Japanese Published Unexamined Patent Application No. Hei 11(1999)-273370. In the IC memory, a data control unit inputs and outputs commands and various data between a data bus and memory chips, and a command control unit generates chip enable for a memory chip from a chip enable signal inputted from the outside according to a command from the outside, generates and outputs an internal serial clock signal for the memory chip by a serial clock generator, and performs reading, writing, or erasure of contiguous data for an identical sector address of a memory chip by one input of a command and the sector address.

SUMMARY OF THE INVENTION

Memory systems employing nonvolatile memories such as flash memories have a fixed number of memory chips mounted therein, and are manufactured by storage capacity such as, e.g., 64 MB and 128 MB products. In a user system, a memory system having a necessary storage capacity is mounted according to the configuration of the user system.

However, in the case where memory systems are manufactured for each storage capacity by directly mounting plural nonvolatile memory chips on one board, since the storage capacity of the memory systems cannot be changed, manufacturers may have an excessive stock for each storage capacity. If an error exists in one of plural memory chips mounted on a board in a memory system, the memory system containing such a chip is treated as a defective product.

Further, in the case where a memory system used in place of hard disk is applied, it is desired that the memory system has a large storage capacity. In that case, the inventor examined memory systems in which a large number of memory chips are mounted, and found that, if plural nonvolatile memories mounted on one board were reset at a time, a large current might flow instantaneously due to the reset, a reset period might be prolonged because of a decrease in a supply voltage of a power circuit, reset processing might not be performed adequately, and the power circuit might be damaged.

An object of the present invention is to provide a nonvolatile memory system whose storage capacity can be easily changed.

Another object of the present invention is to provide a technique for relaxing a large current caused by a reset operation on nonvolatile memories.

These and other objects, and novel features of the present invention will become apparent from the following description and the accompanying drawings.

A brief description will be made of typical inventions disclosed in this application.

That is, a nonvolatile memory system of the present invention comprises: plural memory modules each including plural nonvolatile memories; a controller for controlling the operation of the plural memory modules according to access requests from the outside; and a module selecting decoder that obtains a module enable signal for selectively enabling the memory modules by decoding a selection signal outputted from the controller, wherein the memory modules can be freely mounted or dismounted.

According to the above described means, the module selecting decoder forms a module enable signal for selectively enabling the above described memory modules by decoding a selection signal outputted from the controller. A memory module is selected by the module enable signal. Since the memory modules can be freely mounted or dismounted, the storage capacity of an overall nonvolatile memory system can be changed by increasing or decreasing the memory modules.

At this time, the above described plural memory modules each can be easily configured so as to include a chip selecting decoder for selecting the nonvolatile memories by decoding a selection signal outputted from the controller, and a first control logic that forms a chip selection signal for selecting the nonvolatile memories, based on an output signal of the module selecting decoder and an output signal of the chip selecting decoder.

The above described plural memory modules each can be easily configured so as to include: a chip selecting decoder for selecting the above described nonvolatile memories by decoding a selection signal outputted from the controller; a first control logic that form a chip selection signal for selecting the above described nonvolatile memories, based on an output signal of the module selecting decoder and an output signal of the above described chip selecting decoder; and a second control logic for arresting transmission of control signals from the controller to the plural nonvolatile memories in memory modules not selected by an output signal of the module selecting decoder.

As described above, since control signals outputted from the controller are not transmitted to the plural nonvolatile memories in memory modules not selected by the output signal of the module selecting decoder, even if the number of memory modules is increased, it can be prevented that loads on an output unit of the controller increase to an undesirable level. Therefore, even if the number of memory modules is increased to achieve a large capacity, the driving capacity of the output unit of the controller does not need to be increased, so that the controller does not need to be redesigned.

A reset control unit can be provided which can reset the plural memory modules at a different timing for each of the memory modules in accordance with indications from the controller. According to the reset control unit, since the memory modules are successively reset at a different timing for each of them, current caused by the resets is dispersed over time, with the result that current caused by the resets of the memory modules can be prevented from concentrating.

A reset control unit can be provided which can reset the plural memory modules at a different timing for each of the plural nonvolatile memories in accordance with indications from the controller. Also in that case, since the memory modules are successively reset at a different timing for each of the nonvolatile memories, current caused by the resets is dispersed over time, with the result that current caused by the resets of the nonvolatile memories can be prevented from concentrating.

The reset control unit can be easily formed by providing information holding means having an output terminal corresponding to an input terminal for a reset signal to each of the memory modules. In this case, the reset signals are successively negated by the controller updating information held in the information holding means. At this time, the information holding means can be easily formed by flip-flop circuit and shift registers.

When having plural nonvolatile memories, the controller can be configured so as to include a memory control unit that enables write interleave in a manner that, concurrently with write operations to part of the plural nonvolatile memories, transfers write data to other nonvolatile memories, and a micro processing unit for controlling the operation of the entire controller.

According to the above described interleave, for example, with write data transferred to a first nonvolatile memory, the while the write data is being written to the first nonvolatile memory, the next write data is transferred to a second nonvolatile memory different from the first nonvolatile memory. With this arrangement, data writing performance can be increased. At this time, the interleave can be performed using nonvolatile memories in an identical memory module, and also using nonvolatile memories provided in memory modules different from each other. Also, while both the first and second nonvolatile memories are in the process of writing, write data is controlled so as to be transferred to a third nonvolatile memory different from the first and second nonvolatile memories, with further increased performance. Likewise, even if a fourth nonvolatile memory, a fifth nonvolatile memory, and further a large number of nonvolatile memories are included, further increased performance can be achieved by performing transfer control by the same procedure.

DESCRIPTION OF THE PREFERRED EMBODIMENTS

Figure 1:
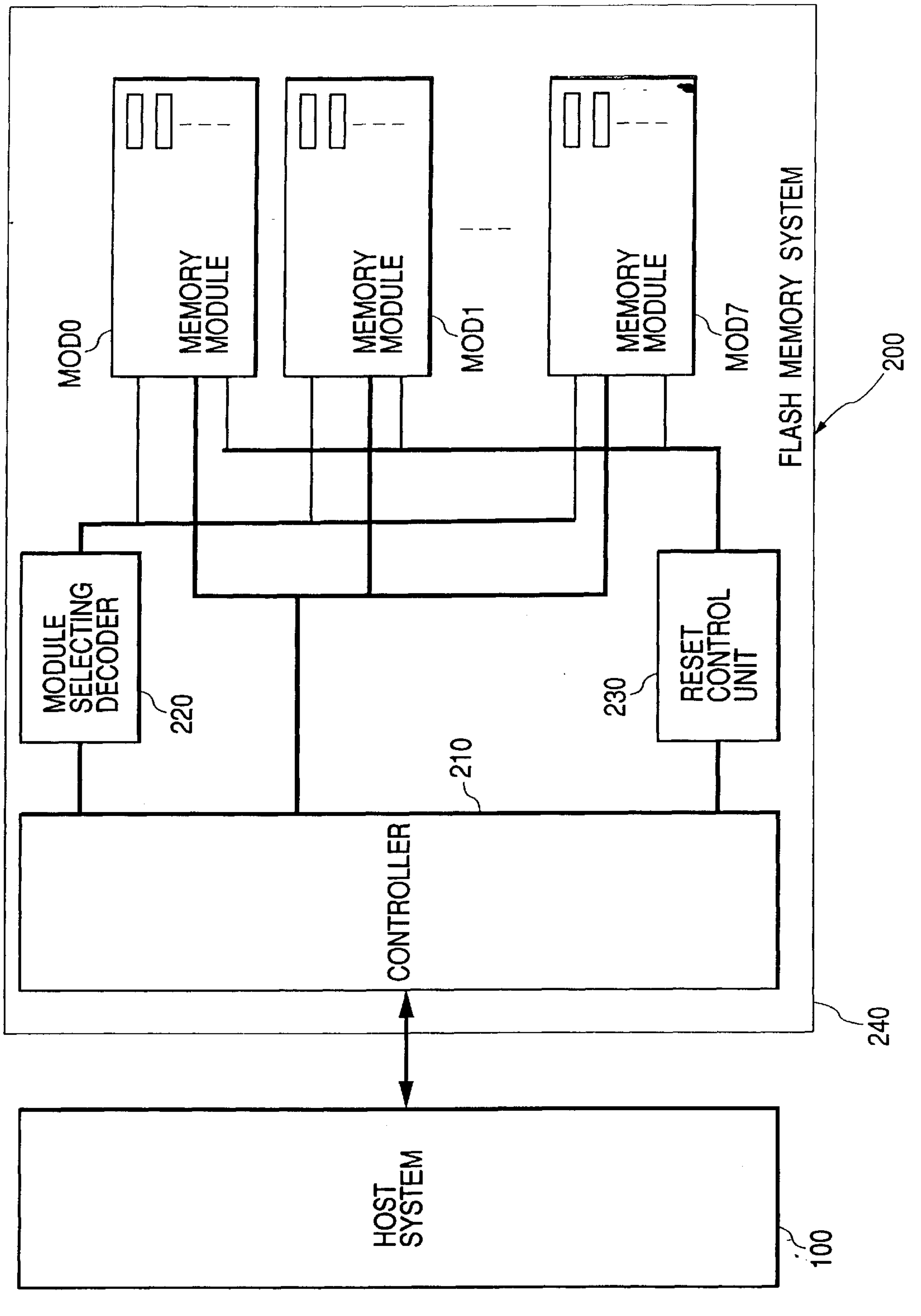
FIG. 1 is a block diagram showing a configuration of a flash memory system as an example of a nonvolatile memory system of the present invention.

FIG. 1 shows a flash memory system as an example of a nonvolatile memory system of the present invention. A flash memory system 200 shown in FIG. 1, although not specially limited, comprises eight memory modules MOD0 to MOD7, a module selecting decoder 220, a reset control unit 230, and a controller 210, which are mounted on a motherboard 240. The flash memory system can be accessed by a host system 100 such as, e.g., a computer system. That is, write data can be written to the memory modules MOD0 to MOD7 upon a write request from the host system 100, and information stored in the memory modules MOD0 to MOD7 can be read upon a read request from the host system 100. The memory modules MOD0 to MOD7, although not specially limited, are each installed with plural flash memories and mounted on the motherboard 240 through sockets provided therein. The controller 210 controls the operation of the plural memory modules according to access requests from the outside of the flash memory system 200. The module selecting decoder 220 obtains a module enable signal for selectively enabling one of the plural memory modules MOD0 to MOD7 by decoding part of a selection signal consisting of plural bits outputted from the controller 210. The reset control unit 230 generates reset signals to successively reset the plural memory modules MOD0 to MOD7 at a different timing for each of the memory modules.

Figure 2:
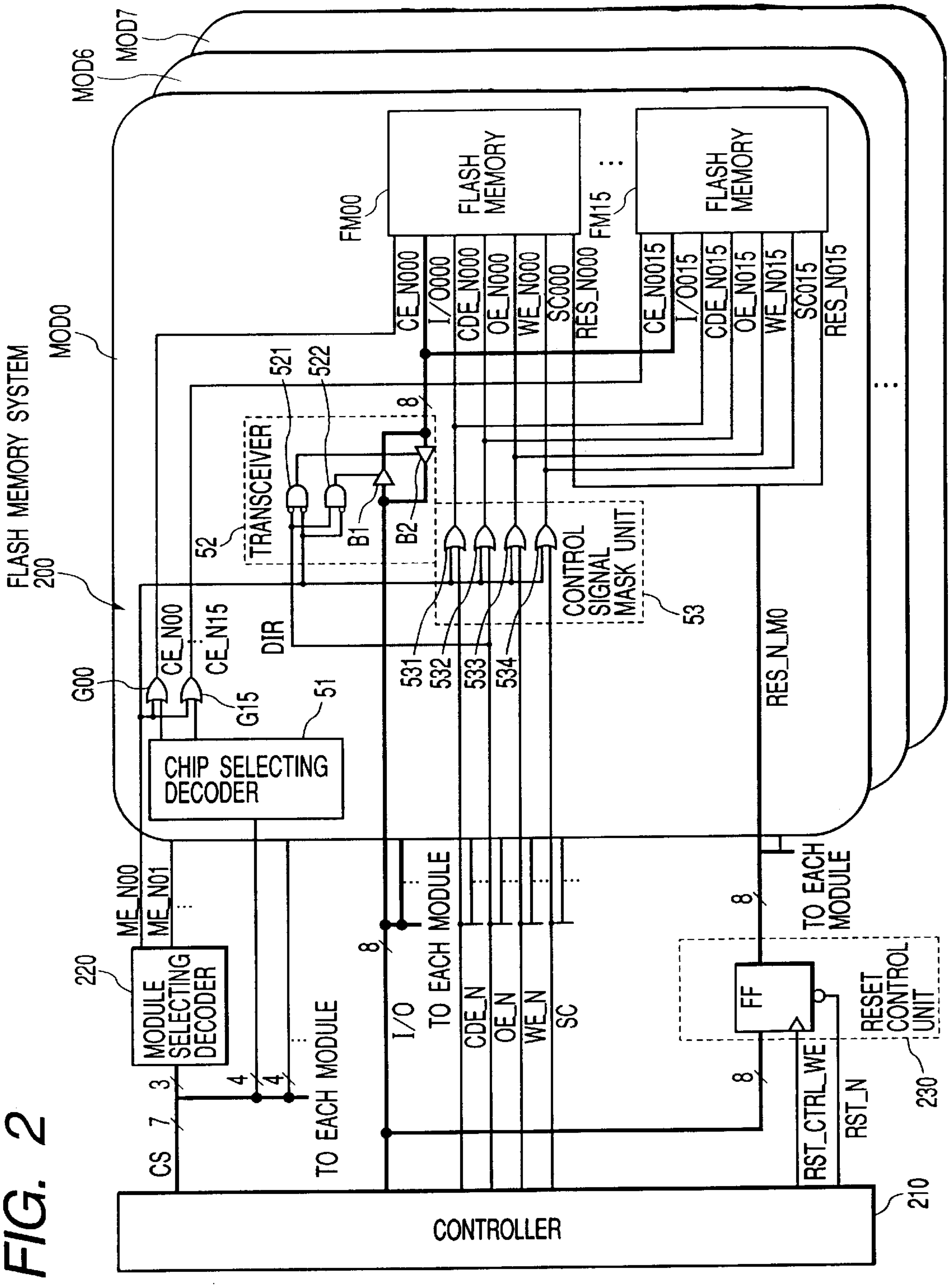
FIG. 2 is a block diagram showing a more detailed configuration of the above described flash memory system.

FIG. 2 shows a more detailed configuration of the above described flash memory system 200.

A selection signal CS consisting of 7 bits is outputted from the controller 210. High-order 3 bits of the 7-bit selection signal are transmitted to the module selecting decoder 220 and low-order 4 bits thereof are transmitted to the memory modules MOD0 to MOD7. The module selecting decoder 220 generates module enable signals ME_N00 to ME_N07, and puts one of the module enable signals ME_N00 to ME_N07 into a selection level by decoding the high-order 3 bits of the 7-bit selection signal. The module enable signals ME_N00 to ME_N07 serve as signals for individually enabling the memory modules MOD0 to MOD7 and are respectively transmitted to corresponding memory modules MOD0 to MOD7. The controller 210 is provided with data input-output terminals consisting of 8 bits, and the data input terminals are connected to the plural memory modules MOD0 to MOD7 through an I/O bus as well as to the reset control unit 230. Further, a command data enable signal CDE_N, an output enable signal OE_N, a write enable signal WE_N, and a serial clock signal SC are outputted from the controller 210 and transmitted to the plural memory modules MOD0 to MOD7. A reset write enable signal RST_CTRL_WE and a reset signal RST_N are outputted from the controller 210 and transmitted to the reset control unit 230. The reset control unit, although not specially limited, comprises a flip-flop circuit FF having an output terminal corresponding to an input terminal for a reset signal to each of the memory modules. Information held in the flip-flop circuit FF is updated by the controller 210. That is, when a reset write enable signal RST_CTRL_WE is activated by the controller 210, information transmitted through the I/O bus is written to the flip-flop circuit FF. Information held in the flip-flop circuit FF is updated by the controller 210, whereby negate timing of reset signals RES_N_M0 to RES_N_M7 corresponding to the memory modules is controlled so that the memory modules MOD0 to MOD7 are reset at a timing different from each other.

Next, a detailed configuration of the memory modules MOD0 to MOD7 will be described. Since the memory modules MOD0 to MOD7 have a configuration identical with each other, only the memory module MOD0 typically shown will be described in detail.

The memory module MOD0, although not specially limited, comprises 16 flash memories FM00 to FM15, a chip selecting decoder 51, gates G00 to G15, a transceiver 52, and a control signal mask unit 53.

The flash memories FM00 to FM15 have a configuration identical with each other and allow data to be read and written independent of each other. For example, the flash memory FM00 is configured as follows.

Figure 9:
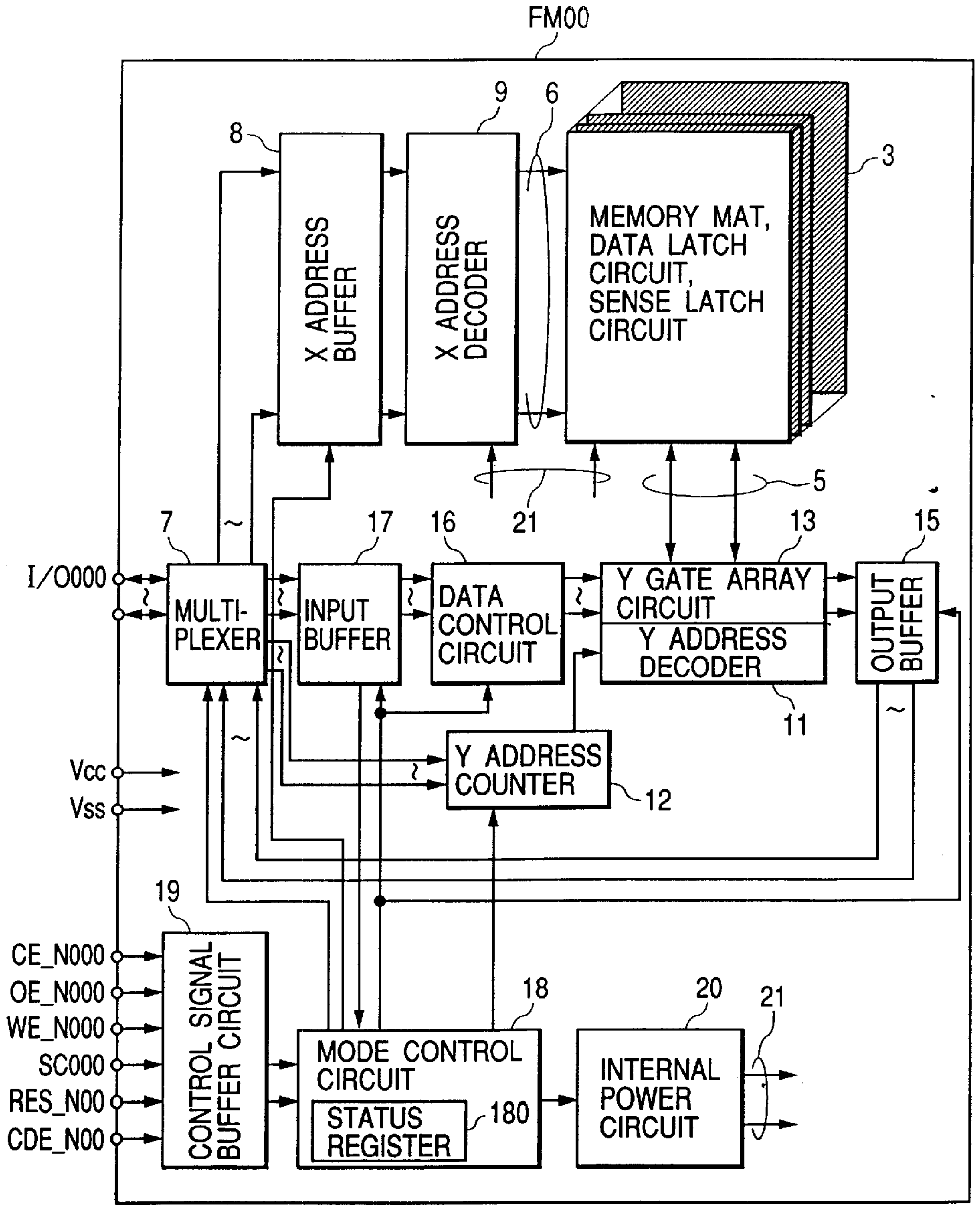
FIG. 9 is a diagram showing a configuration of a flash memory included in the above described flash memory system.

FIG. 9 shows an overall circuit block diagram of the flash memory FM00. The flash memory FM00 shown in the drawing, although not especially limited, is a four-value flash memory to store 2-bit information in one memory cell.

In the drawing, a memory array 3 comprises a memory mat, a data latch circuit, and a sense latch circuit. The memory mat has a large number of nonvolatile memory cell transistors that are electrically erasable and programmable. The memory cell transistors (also referred to as flash memory cells) comprise a source and a drain formed on, e.g., a semiconductor board or within a well, a floating gate formed in a channel region between the source and the drain through a tunnel oxide film, and a control gate overlaid on the floating gate through an interlayer insulating film. The control gate is connected to word lines 6, the drain to bit lines 5, and the source to source lines not shown.

An external input-output terminal I/O000 of the flash memory FM00 consists of 8 bits, and is shared as an address input terminal, a data input terminal, a data output terminal, and a command input terminal. An X address signal inputted from the external input-output terminal I/O000 is supplied to an X address buffer 8 through a multiplexer 7. An X address decoder 9 decodes an internal complementary address signal outputted from the X address buffer 8 and drives the word lines.

A sense latch circuit is provided at one end of the bit lines 5 and a data latch circuit is provided at another end thereof. A bit line 5 is selected by a Y gate array circuit 13, based on a selection signal outputted from a Y address decoder 11. A Y address signal inputted from the external input-output terminal I/O000 is preset in a Y address counter 12, and address signals successively incremented with the preset value as a starting point are supplied to the Y address decoder 11.

The bit line selected in the Y gate array circuit is conducted to an input terminal of an output buffer 15 during data output operation, and is conducted to an output terminal of the data control circuit 16 through an input buffer 17 during data input operation. Connection between the output buffer 15 or input buffer 17 and the input-output terminal I/O000 is controlled by the multiplexer 7. Commands supplied from the input-output terminal I/O000 are presented to a mode control circuit 18 through the multiplexer 7 and the input buffer 17.

To a control signal buffer circuit 19 are connected an input terminal CE_N000 to which a chip enable signal CE_N000 used as an access control signal is inputted; an input terminal OE_N000 for an output enable signal OE_N; an input terminal WE_N000 for a write enable signal WE_N; an input terminal SC000 for a serial clock signal SC; an input terminal RES_N00 for a reset signal RES_N_M0; and an input terminal CDE_N000 for a command data enable signal CED_N. The mode control circuit 18 controls a signal interface with the outside according to the state of these signals and controls internal operations according to inputted commands. For command input or data input to the input-output terminal I/O000, a command data enable signal inputted from the terminal CDE_N000 is asserted; for command input, further, a signal of the terminal WE_N000 is asserted; and for data input, a signal of the terminal WE_N000 is negated. For address input, a signal of the terminal CED_N000 is negated and a signal of the terminal WE_N000 is asserted. Thereby, the mode control circuit 18 can distinguish among commands, data, and addresses inputted in multiplexed form from the external input-output terminal I/O000. Although not shown, a ready (RDY) signal and a busy (BSY) signal are asserted during an erasing or programming operation to indicate the state of the operation to the outside.

An internal power circuit (internal voltage generating circuit) 20 generates operation power 21 used as various internal voltages for writing, erasing, verifying, and reading, and supplies it to the X address decoder 9 and the memory cell array 3.

The mode control circuit 18 controls the overall flash memory FM00 according to input commands. The operation of the flash memory FM00 is, in principle, decided by commands. Commands for the flash memory include, e.g., commands for reading, erasing, writing, and updating. Command codes are represented in hexadecimal notation. A hexadecimal number is indicated by a symbol "h".

The flash memory FM00 has a status register 180 to indicate its internal state, and its contents can be read from the input-output terminal I/O000 by asserting the signal OE_N000.

In the multilevel information storage technique to be achieved by the flash memory FM00, an information storage state of one memory cell is one of an erasure state ("11"), a first write state ("10"), a second write state ("00"), and a third write state ("01"). The four information storage states in total are decided by 2-bit data. That is, 2-bit data is stored in one memory cell.

Write verify voltages applied to word lines during a write operation after, e.g., erasure are set to three types of voltages different from each other so that the write operation is performed separately three times by successively switching the three types of voltages. A bit line selected for writing is applied with 0 V and bit lines not selected are applied with 6 V. Although not specially limited, word lines are applied with, e.g., 17 V. As a high voltage for the above writing is applied for a longer period of time, a threshold voltage of memory cells becomes higher. Control of three types of write threshold voltages can be performed by time control of such a high voltage state and further by level control of high voltages applied to word lines.

Whether 0 or 6V is applied to bit lines is decided by a logical value of write control information latched in a sense latch circuit. The write operation selection memory mat performs control so that writing is not selected when latch data of a sense latch is a logical value "1", and writing is selected when a logical value "0". The control will be later described in detail. During collective erasure of a sector, a selected word line is applied with −16V, word lines not selected are applied with 0 V, and a selected bit line is applied with 2 V.

In FIG. 2, the chip selecting decoder 51 gets and decodes low-order 4 bits (second selection signal) of a 7-bit selection signal CS outputted from the controller 210 to obtain a signal for selecting one of the plural flash memories FM00 to FM15. The 16 logic gates G00 to G15 form chip enable signals CE_N00 to CE_15 for selectively enabling the flash memories FM00 to FM15 by ORing an output signal of the chip selecting decoder 51 and a module enable signal ME_N00 from the memory module selecting decoder 220. For example, when the chip enable signal CE_N00 is asserted low, the flash memory FM00 is enabled, and when the chip enable signal CE_N15 is asserted low, the flash memory FM15 is enabled.

The transceiver 52 decides a data transfer direction, and includes tri-state buffers B1 an B2 connected in parallel in a direction opposite to each other and logic gates 521 and 522 for selectively conducting the tri-state buffers B1 and B2. A module enable signal ME_N00 from the module selecting decoder 220 is transmitted to one input terminal of each of the logic gates 521 and 522, and an output enable signal OE_N from the controller 210 is transmitted as a DIR signal to another input terminal of each of the logic gates 521 and 522. With the module enable signal ME_N00 from the module selecting decoder 220 asserted low, if the output enable signal OE_N (DIR) is high, an output signal of the logic gate 522 is driven high, with the result that the tri-state buffer B1 is put into conduction. At this time, since an output signal of the logic gate 521 is driven low, the tri-state buffer B2 is put into non-conduction. Where the tri-state buffer B1 is put into conduction, data transmitted through the I/O bus from the controller 210 is transmitted to the flash memories FM00 to FM15. With the module enable signal ME_N00 from the module selecting decoder 220 asserted low, if the output enable signal OE_N (DIR) is low, an output signal of the logic gate 521 is driven high, with the result that the tristate buffer B2 is put into conduction. At this time, since an output signal of the logic gate 522 is driven low, the tri-state buffer B1 is put into nonconduction. Where the tri-state buffer B2 is put into conduction, data read from the flash memories FM00 to FM15 is transmitted to the controller 210 and other memory modules MOD1 to MOD7 through the tri-state buffer B2.

The control signal mask unit 53 includes four logic gates 531 to 534 that obtain an OR logic of input signals. In a period during which a module enable signal ME_N00 from the module selecting decoder 220 is asserted low, signals CDE_N, OE_N, WE_N, and SC outputted from the controller 210 are transmitted to the flash memories FM00 to FM15 through the logic gates 531 to 534. In a period during which a module enable signal ME_N00 from the module selecting decoder 220 is negated high, signals CDE_N, OE_N, WE_N, and SC outputted from the controller 210 are not transmitted to the flash memories FM00 to FM15 because they are masked by the logic gates 531 to 534.

Figure 6:
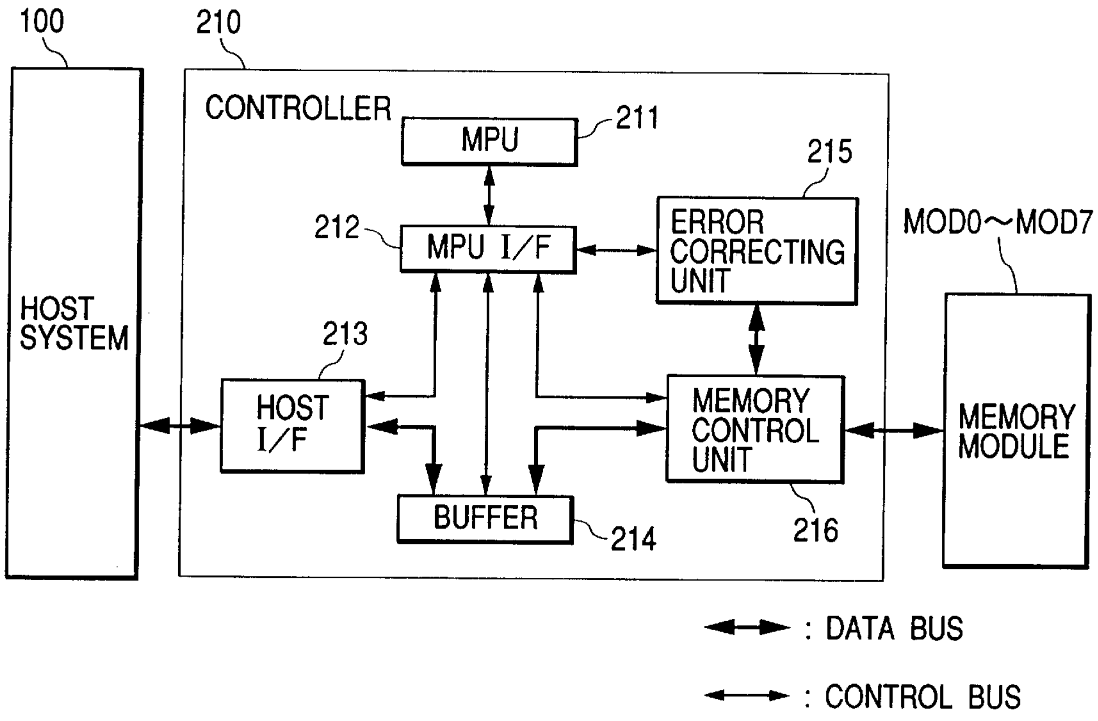
FIG. 6 is a block diagram showing a configuration of a controller included in the above described flash memory system.

FIG. 6 shows a configuration of the controller 210.

The controller 210, although not specially limited, comprises: a micro processing unit (MPU) 211; an MPU interface 212 for mediating a data transfer between the MPU 211 and internal blocks of the controller; an error correcting unit 215 for performing data corrections in a data transfer; a host interface 213 for mediating a data transfer to and from a host system 100; a memory control unit 216 for controlling the operation of the memory modules MOD0 to MOD7; and a buffer 214 for buffering a data transfer speed difference. The buffer 214 is placed to buffer a difference between a data transfer speed between the host system 100 and the host interface 213, and a data transfer speed between the memory modules MOD0 to MOD7 and the memory control unit 216. The host interface 213, although not specially limited, complies with the ATA or PCMCIA standards.

Various signals CS, CDE_N, OE_N, WE_N, SC, RST_CTRL_WE, and RST_N shown in FIG. 2, and data outputted to the I/O bus are outputted from the memory control unit 216 within the controller 210.

Figure 3:
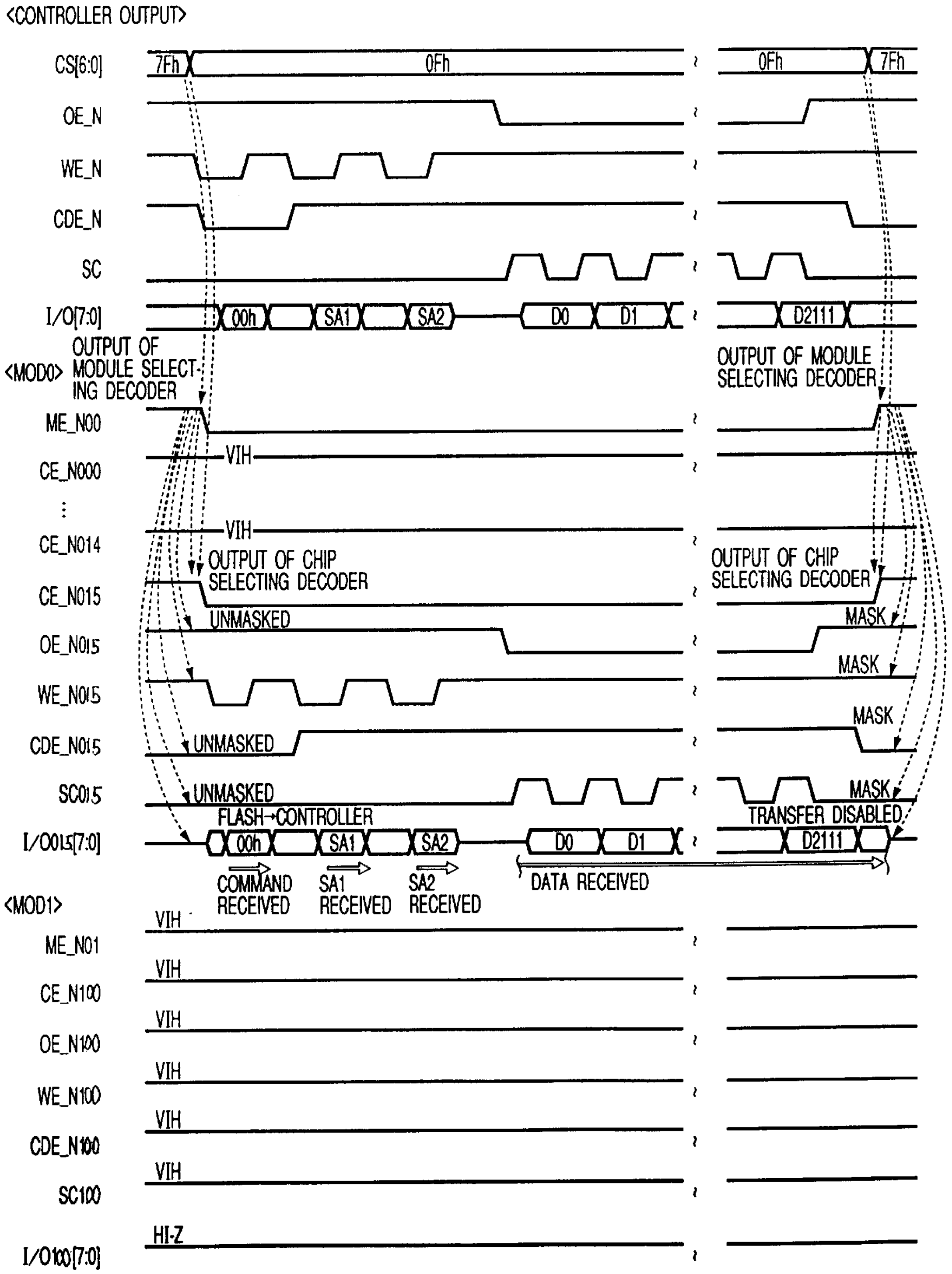
FIG. 3 is a diagram showing operation timing of major units during reading in the above described flash memory system.

FIG. 3 shows operation timing of reading from the flash memory FM15 in the memory module MOD0.

When a 7-bit selection signal CS[6:0] outputted from the controller 210 is "0Fh", high-order 3 bits of it are decoded by the module selecting decoder 220 and the module enable signal ME_N00 is asserted low, whereby the memory module MOD0 is selected. At this time, other memory modules MOD1 to MOD7 are put in a non-selection state. Low-order 4 bits of the selection signal CS[6:0] are decoded by the chip selecting decoder 51, and the chip enable signal CE_N15 used as an output signal of the logic gate G15 is asserted low based on the decoded output signal and a decode output signal of the module selecting decoder 220, whereby the flash memory FM15 in the memory module MOD0 is selected. At this time, other flash memories FM00 to FM14 in the memory module MOD0 are put in a non-selection state.

Since the module enable signal ME_N00 is asserted low by the module selecting decoder 220, in the memory module MOD0, a mask in the control signal mask unit 53 is removed and signals CDE_N, OE_N, WE_N, and SC outputted from the controller 210 are transmitted to the flash memory FM15 through the control signal mask unit 53 in the memory module MOD0. At this time, in other memory modules MOD1 to MOD7, since the module enable signals ME_N01 to ME_N07 from the module selecting decoder 220 are negated high, the signals CDE_N, OE_N, WE_N, and SC outputted from the controller 210 are not transmitted to the flash memories FM00 to FM15 because they are masked in the control signal mask units 53 in the memory modules MOD1 to MOD7. In this way, in memory modules put in a non-selection state, since the signals CDE_N, OE_N, WE_N, and SC outputted from the controller 210 are masked, loads on an output buffer of the signals CDE_N, OE_N, WE_N, and SC in the controller 210 can be reduced.

The transceiver 52 is controlled by the logic of the output enable signal OE_N, with the result that a bus transfer direction is decided. That is, the tri-state buffer B1 is conducted in a period during which the output enable signal OE_N is negated high, whereby a data transfer from the controller 210 to the flash memories FM00 to FM15 is enabled. Also, the tri-state buffer B2 is conducted in a period during which the output enable signal OE_N is asserted low, whereby a data transfer from the flash memories FM00 to FM15 to the controller 210 is enabled.

In a period during which the module enable signal ME_N00 is asserted low, first, a command of "00h" is received, and after the address of "SA1" is received and the address of "SA2" is received, the tri-state buffer B2 is conducted in a period during which the output enable signal OE_N is negated to a low level, whereby a data transfer from the flash memories FM00 to FM15 to the controller 210 is enabled so that data D1 to D2111 read from the flash memory FM15 is transmitted to the controller 210 through the tri-state buffer B2.

A 7-bit selection signal CS[6:0] outputted from the controller 210 becomes "7Fh" and the module enable signal ME_N00 is negated high, whereby the signals CDE_N, OE_N, WE_N, and SC outputted from the controller 210 are masked by the control signal mask unit 53 in the memory module MOD0.

The memory module MOD1 and other memory modules are put in a non-selection state and various signals inputted thereto are negated high.

Figure 4:
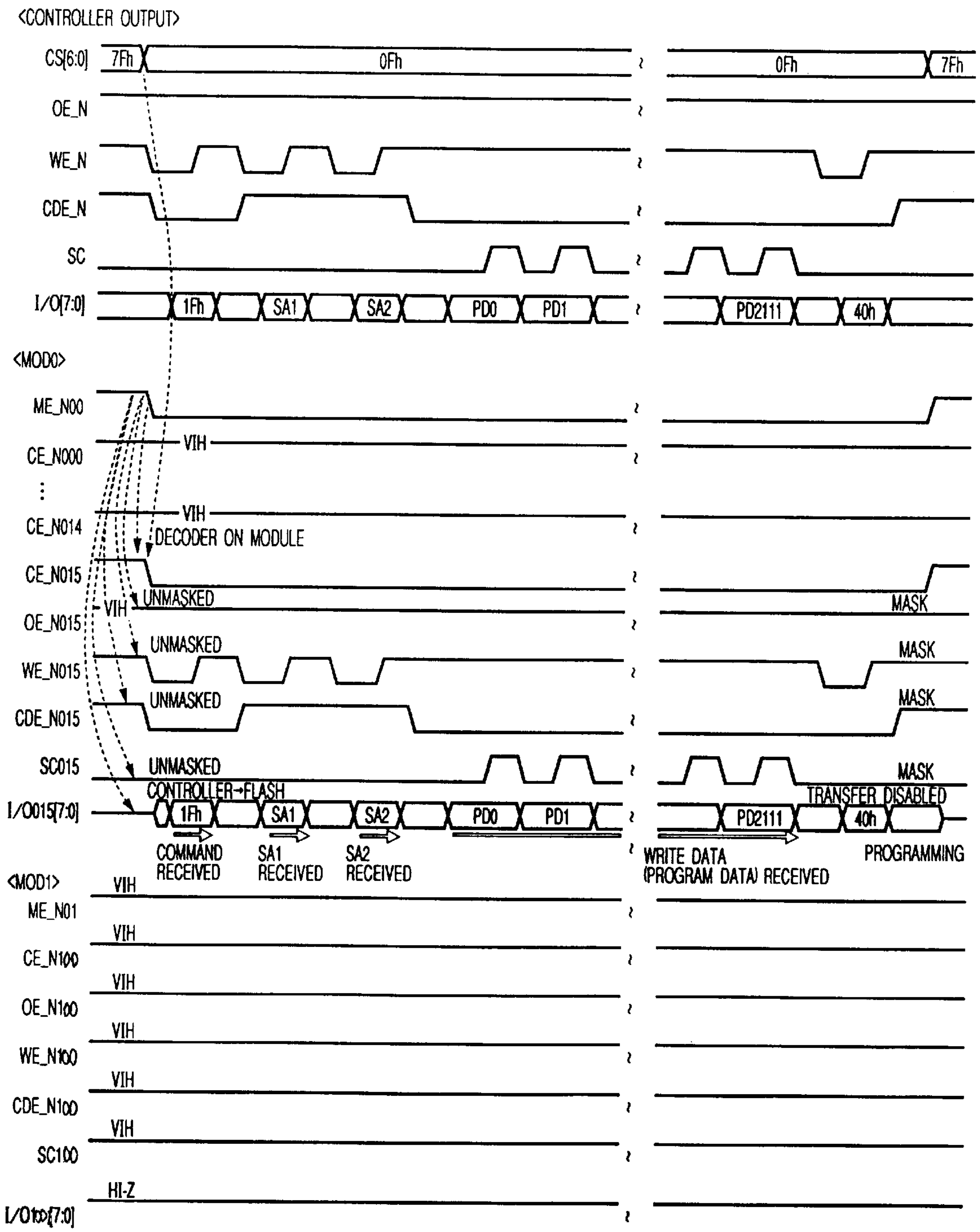
FIG. 4 is a diagram showing operation timing of major units during writing in the above described flash memory system.

FIG. 4 shows operation timing of writing to the flash memory FM15 in the memory module MOD0.

When a 7-bit selection signal CS[6:0] outputted from the controller 210 becomes "0Fh", high-order 3 bits of it are decoded by the module selecting decoder 220 and the module enable signal ME_N00 is asserted low, whereby the memory module MOD0 is selected. Low-order 4 bits of the selection signal CS[6:0] are decoded by the chip selecting decoder 51, and the chip enable signal CE_N15 used as an output signal of the logic gate G15 is asserted low based on the decoded output signal and a decode output signal of the module selecting decoder 220, whereby the flash memory FM15 in the memory module MOD0 is selected.

In a period during which the module enable signal ME_N00 is asserted low, a command of "1Fh" is received, the address of "SA1" is received, the address of "SA2" is received, write data (program data) is received, and data writing (program) is performed. For programming, the value of the status register 180 is read to determine whether programming (writing) is terminated.

The output enable signal OE_N is negated high and the tri-state buffer B1 is conducted in that period, whereby a data transfer from the controller 210 to the flash memories FM00 to FM15 is enabled. Write data is indicated by PD0 to PD2111. Upon receipt of a command of "40h", programming (writing) to memory cells is started.

Figure 5:
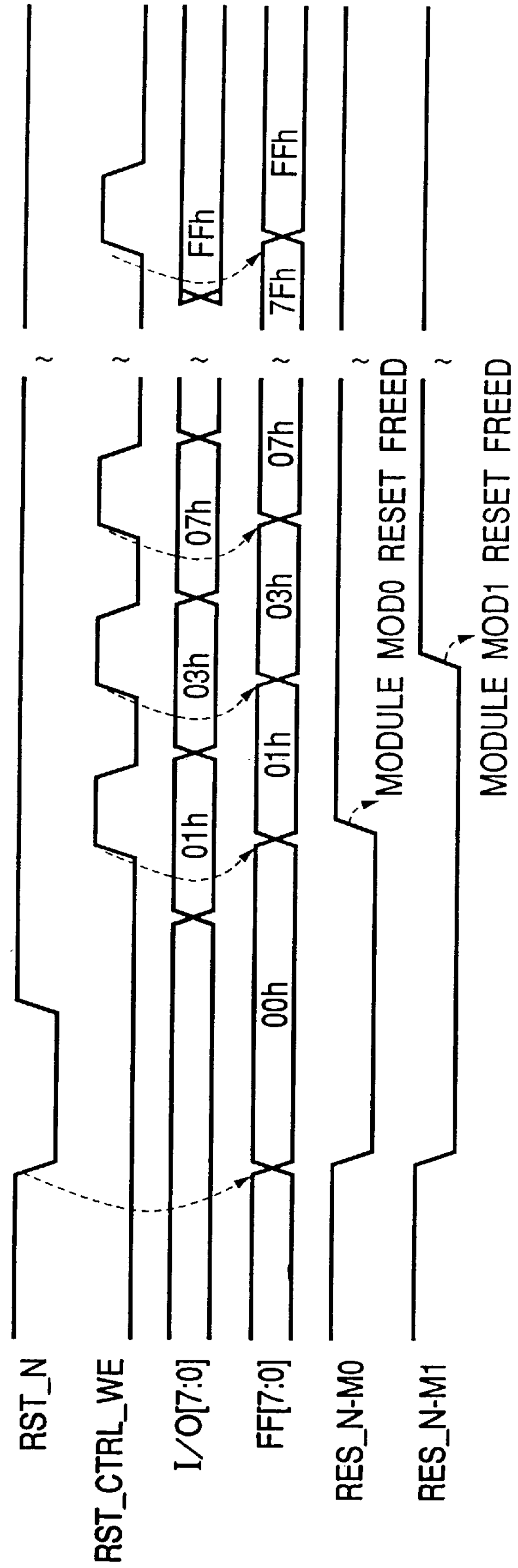
FIG. 5 is a diagram showing operation timing of resetting in the above described flash memory system.

FIG. 5 shows operation timing of resetting.

When the reset signal RST_N is asserted low by the controller 210, the flip-flop circuit FF within the reset control unit 230 is initialized with "00h". Output of the flip-flop circuit FF consists of 8 bits, each of which is connected to a reset input terminal of each of the memory modules MOD0 to MOD7. Thereby, memory modules corresponding to bits of the flip-flop circuit to which a logical value "1" is written are reset-freed. Each time the reset write enable signal RST_CTRL_WE is asserted high by the controller 210, a value of the I/O bus is captured, whereby information held in the flip-flop circuit FF is successively updated. In the example shown in FIG. 5, information held in the flip-flop circuit FF is updated to "00h", "01", "03h", and "07h", whereby output bits of the flip-flop circuit FF are inverted to the logical value "1" successively from the least significant bit. In an example shown in FIG. 5, when output of the flip-flop circuit FF is "00h", all the memory modules MOD0 to MOD7 are in reset state. When output of the flip-flop circuit FF is "01h", the reset signal RES_N_M0 in the memory module MOD0 is driven high, whereby all flash memories FM00 to FM15 in the memory module MOD0 are reset-freed. When output of the flip-flop circuit FF is "03h", the reset signal RES_N_M1 in the memory module MOD1 is driven high, whereby all flash memories FM00 to FM15 in the memory module MOD1 are reset-freed. Since much current flows through a memory module immediately after a reset is freed, by resetting the memory modules at a different timing for each of them as described above, current caused by the resets can be dispersed over time, with the result that current caused by the resets of the memory modules can be prevented from concentrating. The same function can also be achieved by connecting a shift register in place of the I/O bus at the input side of the flip-flop circuit FF, and further without having to use a flip-flop circuit, by supplying reset signals to the modules at a different timing for each of them.

Write interleave can be performed by control of the controller 210.

After write data is transferred, the flash memories FM00 to FM15 require a huge amount of time for internal writing (programming). The flash memories cannot accept the next command from the controller 210 in the course of the programming. Accordingly, in write interleave, while one flash memory is being programmed, write data is transferred to the next flash memory. Writing performance can be increased by transferring write data to the flash memories in a manner that transfers the next write data during a waiting time until programming is completed.

Figure 7:
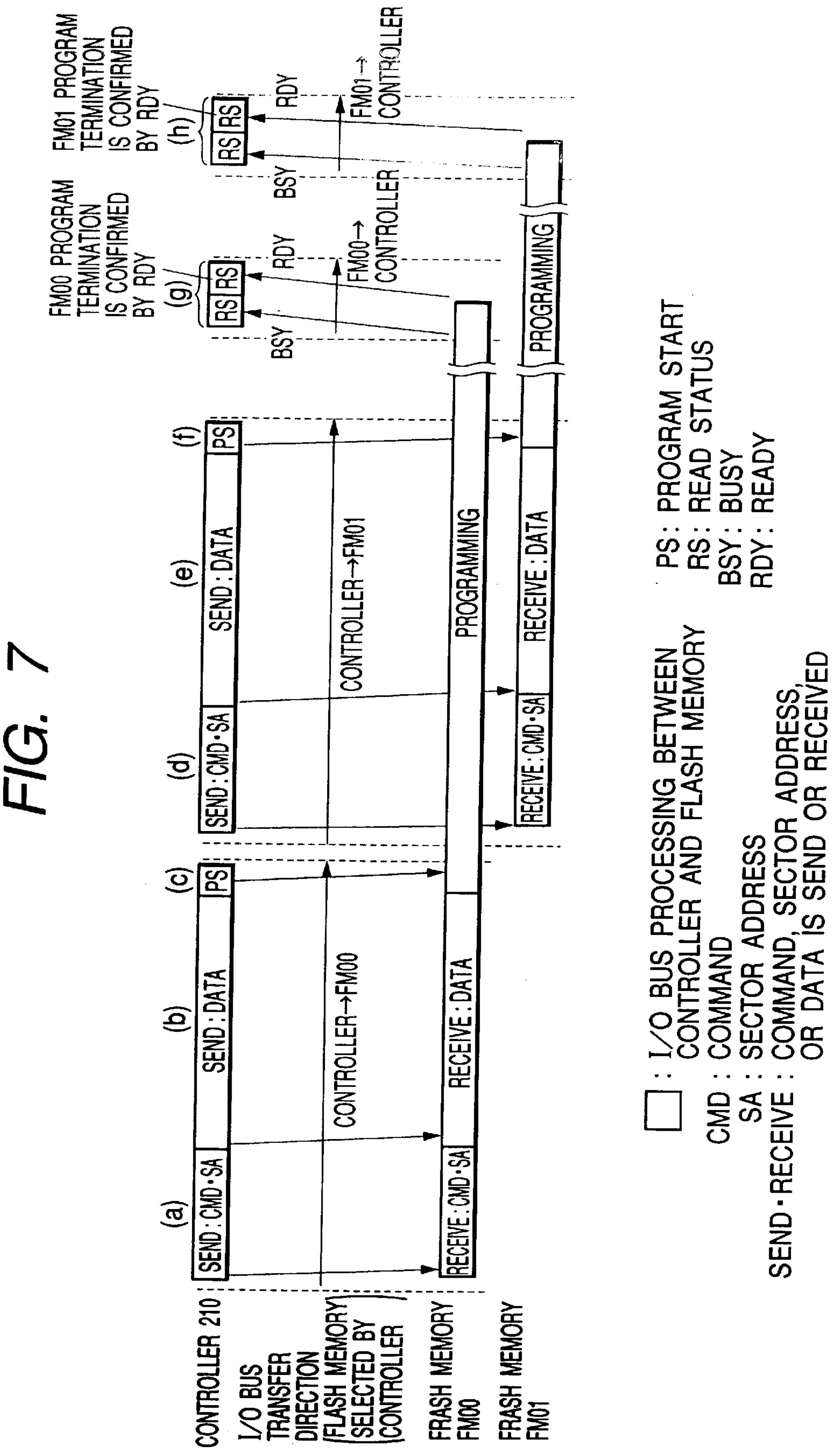
FIG. 7 is a diagram for explaining basic operations of write interleave in the above described flash memory system.

FIG. 7 shows basic operations of write interleave.

In the drawing is shown a case where write interleave is performed using flash memory FM00 and flash memory FM01 (not shown) in an identical memory block MOD0.

First, the flash memory FM00 is selected, and in that state, a command is issued and a sector address is specified (a). Next, write data is transferred to the flash memory FM00 (b), and programming (writing) to the flash memory FM0 is started by a command (PS) (c), so that programming is performed in the flash memory FM00.

In the course of the programming of the flash memory FM00, flash memory FM01 is selected, and in that state, a command is issued and a sector address is specified (d). Next, write data is transferred to the flash memory FM01 (e), and programming (writing) to the flash memory FM01 is started by a command (PS) (f), so that programming is performed in the flash memory FM01.

Next, the flash memory FM00 is selected and a status (RS) of the flash memory FM00 is read (g). When a busy signal (BSY) is returned, it indicates that the flash memory FM00 is being programmed. If the busy signal (BSY) is returned, the controller continues to perform status reading. If a ready signal (RDY) is returned in the status reading, it indicates that the flash memory FM00 has been programmed.

In the same way, the flash memory FM01 is selected, and a status (RS) of the flash memory FM01 is read (h) to determine whether the flash memory FM01 has been programmed.

Figure 8:
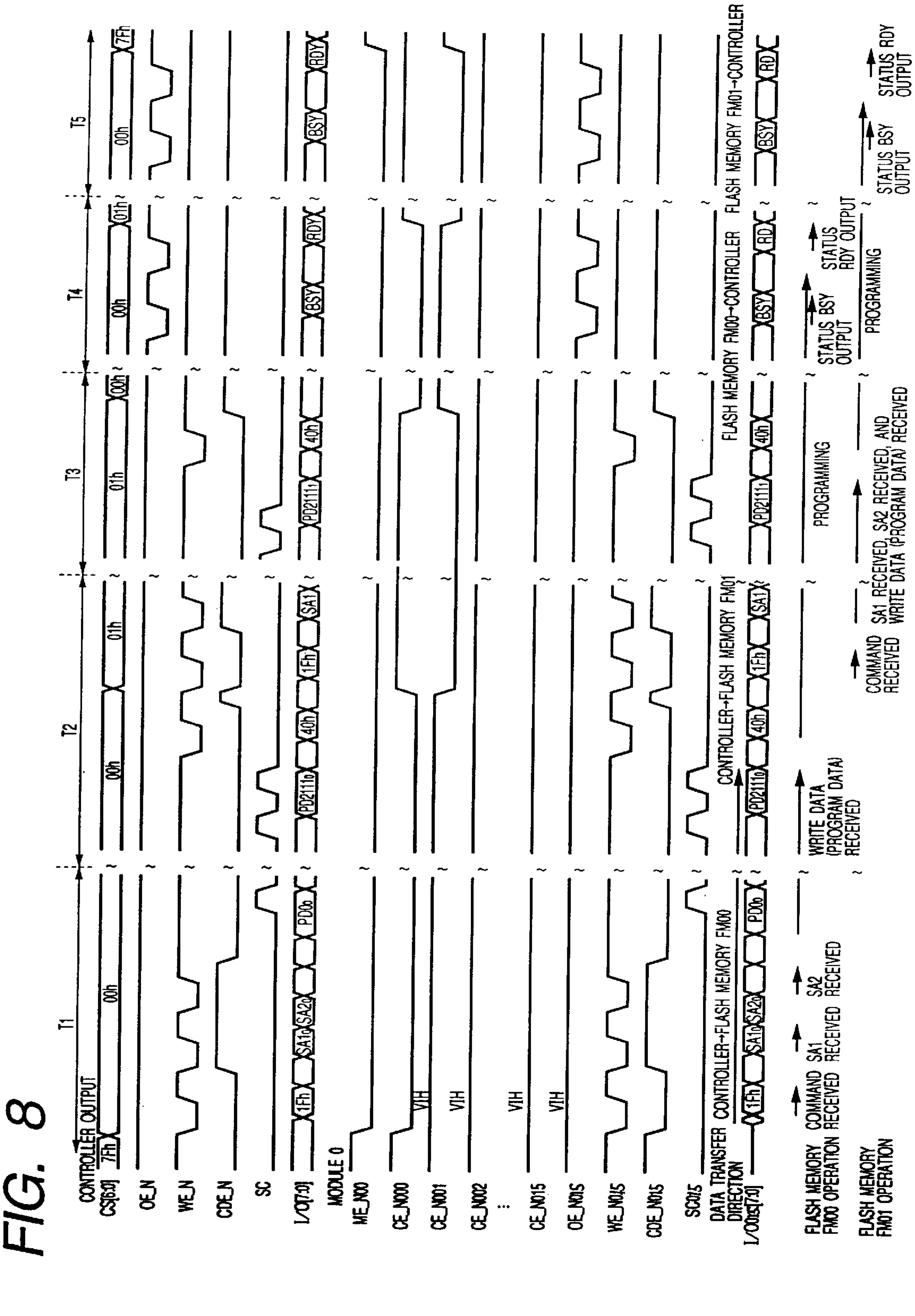
FIG. 8 is a diagram showing operation timing of units during write interleave in the above described flash memory system.

FIG. 8 shows operation timing of units during write interleave.

In the drawing is shown a case where write interleave is performed using flash memory FM00 and flash memory FM01 (not shown) in an identical memory block MOD0.

First, in period T1, the flash memory FM00 performs command reception, reception of "SA1" address, reception of "SA2" address, and reception of write data (program data). That is, When a 7-bit selection signal CS[6:0] outputted from the controller 210 is "00h", high-order 3 bits of it are decoded by the module selecting decoder 220 and the module enable signal ME_N00 is asserted low, whereby the memory module MOD0 is selected. Low-order 4 bits of the selection signal CS[6:0] are decoded by the chip selecting decoder 51, and a chip enable signal CE_N00 used as an output signal of the logic gate G00 is asserted low based on the decoded output signal and a decode output signal of the module selecting decoder 220, whereby the flash memory FM00 in the memory module MOD0 is selected.

Since the module enable signal ME_N00 is asserted low by the module selecting decoder 220, in the memory module MOD0, a mask in the control signal mask unit 53 is removed and signals CDE_N, OE_N, WE_N, and SC outputted from the controller 210 are transmitted to the flash memory FM00 through the control signal mask unit 53 in the memory module MOD0.

Since the output enable signal OE_N is negated high, the tri-state buffer B1 is conducted in the transceiver 52, whereby a data transfer from the controller 210 to the flash memory FM00 is enabled.

In a period during which the chip enable signal CE_N00 is asserted low, a command of "1Fh" is received, the address of "SA1" is received, the address of "SA2" is received, and then write data $PD0_0$ to $PD2111_0$ is captured synchronously with a serial clock signal based on a serial clock signal SC transmitted from the controller 210. The capturing of the write data extends to a period T2.

A command of "40h" is received in the period T2, whereby programming (writing) of the write data $PD0_0$ to $PD2111_0$ is started in the flash memory FM00. After the programming (writing) of the write data $PD0_0$ to $PD2111_0$ is started, a 7-bit selection signal CS[6:0] outputted from the controller 210 is changed from "00h" to "01h". A chip enable signal CE_N01 used as an output signal of a logic gate G15 is asserted low by the change of the selection signal, whereby the flash memory FM01 in the memory module MOD0 is selected.

In a period during which the chip enable signal CE_N00 is asserted low, a command of "1Fh" is received, the address of "SA1" is received, the address of "SA2" is received, and then write data $PD0_1$ to $PD2111_1$ is captured synchronously with a serial clock signal based on a serial clock signal SC transmitted from the controller 210. The capturing of the write data extends to a period T3.

A command of "40h" is received in the period T3, whereby programming (writing) of the write data $PD0_1$ to $PD2111_1$ is started in the flash memory FMOL.

After the programming (writing) of the write data $PDO_1$ to $PD2111_1$ is started, a 7-bit selection signal CS[6:0] outputted from the controller 210 is changed from "01h" to "00h". The chip enable signal CE_N00 used as an output signal of the logic gate G00 is asserted low by the change of the selection signal, whereby the flash memory FM00 in the memory module MOD0 is selected and the status of the flash memory FM00 is read by the controller 210 (T4). If a ready signal (RDY) is returned in the status reading, since it indicates that the programming is completed, the 7-bit selection signal CS[6:0] is changed from "00h" to "01h" and the status of the flash memory FM01 is read (T5).

In this way, in the write interleave, since write data transfer to another flash memory FM01 is started while the flash memory FM00 is being programmed, writing performance can be increased.

According to the above example, effects described above can be obtained.

(1) A flash memory system comprises: plural memory modules MOD0 to MOD7; a controller 210 for controlling the operation of the plural memory modules in accordance with access requests from the outside; and a module selecting decoder 220 for obtaining a module enable signal for selectively enabling one of the plural memory modules by decoding a selection signal outputted from the controller, and the storage capacity of the flash memory system can be easily changed by increasing or decreasing the memory modules which can be freely mounted or dismounted. Since the storage capacity of the flash memory system can thus be easily changed, it is avoidable to stock flash memory systems on a capacity basis. Since the storage capacity of an overall nonvolatile memory system can be changed by increasing or decreasing the memory modules, even if nonvolatile memories or memory modules are damaged, the memory system can recover by replacing the damaged memory modules.

(2) The above described plural memory modules MOD0 to MOD7 each include a chip selecting decoder 51 that obtains a signal for selecting one of the above described plural flash memories by decoding high-order 3 bits of a 7-bit selection signal outputted from the controller 210, and logic gates G00 to G15 that form a chip selection signal for selecting one of the plural nonvolatile memories, based on an output signal of the module selecting decoder 220 and an output signal of the above described chip selecting decoder 51. With this arrangement, chip selection signals CE_N00 to CE_N15 can be easily generated for each of the memory modules MOD0 to MOD7.

(3) The above described plural nonvolatile memories in memory modules not selected by an output signal of the module selecting decoder 220 are provided with a control signal mask unit 53 for arresting transmission of control signals outputted from the controller. With this arrangement, even if the number of memory modules is increased, it can be prevented that loads on an output unit of the controller 210 increase to an undesirable level. Therefore, even if the number of memory modules is increased to achieve a large capacity, the driving capacity of the output unit of the controller 210 does not need to be increased, so that the controller 210 does not need to be redesigned.

(4) A reset control unit 230 is provided which can reset the plural memory modules MOD0 to MOD7 at a different timing for each of the memory modules in accordance with indications from the controller 210. With this arrangement, since the memory modules are successively reset at a different timing for each of them, current caused by the resets is dispersed over time, with the result that current caused by the resets of the memory modules can be prevented from concentrating.

(5) The reset control unit 230 can be easily formed by providing a flip-flop circuit FF having an output terminal corresponding to an input terminal for a reset signal to each of the memory modules. In that case, by updating information held in the flip-flop circuit FF by the controller 210, the reset signals can be successively negated.

(6) The controller 210 performs write interleave in a manner that transfers write data to a predetermined flash memory FM00 of the plural flash memories FM00 to FM15, and transfers the next write data to, e.g., the flash memory FM01 while the above described write data is being written to the above described flash memory FM00, with increased data writing performance.

The present invention has been described in detail. It goes without saying that the present invention is not limited to the above-described embodiments, and variations and modifications may be made without departing from the scope of the present invention.

For example, the memory modules MOD0 to MOD7 each may comprise at least one flash memory. The flash memory system 200 may comprise at least one memory module.

In the above described example, the flash memories FM00 to FM15 are multilevel memories wherein an information storage state of one memory cell is a selected one of an erasure state ("11"), a first write state ("10"), a second write state ("00"), and a third write state ("01") such that the four information storage states in total are decided by 2-bit data. Alternatively, the flash memories FM00 to FM15 may be formed by storing 1-bit data in one memory cell, so-called binary memories.

Since the reset control unit 230 may have only the function to successively change logical values in plural output bits, it may be formed by a shift register instead of the flip-flop circuit FF.

Although the flash memory system, in the above described example, performs a reset at a different timing for each of the memory modules, a reset may be performed at a different timing for each of the flash memories under control of the reset control unit 230, with the same effect that current concentration caused by the resets can be prevented. In this case, in the reset control unit 230, reset signals inputted to the flash memories FM00 to FM15 are formed so that they are negated in timings different from each other.

Although, in the above example, the buffer 214 is included in the controller 210 as shown in FIG. 6, a buffer placed outside the controller 210 may be used in place of the internal buffer 214.

Although, in the above example, one of the plural flash memories FM00 to FM15 is selected based on a decode output signal of the chip selecting decoder 51, plural flash memories may be selected at the same time by the chip selecting decoder 51. For example, two chip enable signals CE_N00 and CE01_N01 are asserted low by a decode output of the chip selecting decoder 51, whereby both the flash memories FM00 and FM01 are selected at the same time so that concurrent access to the flash memories FM00 and FM01 is enabled. To enable concurrent access to plural flash memories, the bus width of the I/O bus is widened according to the number of flash memories to be accessed at the same time. For example, where a bus width of 8 bit is required to write or read data to or from one flash memory, to enable concurrent access to two flash memories, the I/O bus is configured so as to have a width of 16 bits so that the high-order 8 bits are assigned to one flash memory and the low-order 8 bits are assigned to another flash memory.

Although, in the above example, write interleave is performed between two flash memories, the write interleave may be performed between three or more flash memories. Write interleave between, e.g., three or more flash memories may be performed as follows.

First, the flash memory FM00 is selected, and in that state, a command is issued and a sector address is specified. Next, write data is transferred to the flash memory FM00, and programming (writing) to the flash memory FM00 is started by a command, so that programming to the flash memory FM00 is performed.

In the course of the programming of the flash memory FM00, flash memory FM01 is selected, and in that state, a command is issued and a sector address is specified. Next, write data is transferred to the flash memory FM01, and programming (writing) to the flash memory FM01 is started by a command, so that the flash memory FM01 is programmed.

Next, in the course of the programming of the flash memories FM00 and FM01, flash memory FM02 is selected, and in that state, a command is issued and a sector address is specified. write data is transferred to the flash memory FM02, and programming (writing) to the flash memory FM02 is started by a command, so that the flash memory FM02 is programmed.

In this way, in the course of the programming of a flash memory, for another flash memory, a command is issued, a sector address is specified, and write data is transferred. Thereby, write interleave between three or more flash memories is enabled.

Writing by the write interleave can also be performed between the memory modules MOD0 to MOD7 different from each other.

The foregoing description has been made on a case where the invention of the inventor applies to a flash memory system, which is an application field as a background of the invention. However, the present invention can, without being limited to it, apply to nonvolatile memory systems comprising various nonvolatile memories.

The present invention can be applied under the condition that at least a nonvolatile memory is included.

Effects obtained by typical ones of inventions disclosed in this application will be described briefly below.

That is, the module selecting decoder forms a module enable signal for selectively enabling a memory module by decoding a selection signal outputted from the controller, and selects a memory module by the module enable signal. Since the memory modules can be freely mounted or dismounted, the storage capacity of an overall nonvolatile memory system can be changed by increasing or decreasing the memory modules.

At this time, the above described plural memory modules each can be easily configured so as to include a chip selecting decoder that obtains a signal for selecting the above described nonvolatile memories by decoding a selection signal outputted from the controller, and a first control logic that form a chip selection signal for selecting the above described nonvolatile memories, based on an output signal of the module selecting decoder and an output signal of the above described chip selecting decoder.

Control signals outputted from the controller are not transmitted to plural nonvolatile memories in memory modules not selected by an output signal of the module selecting decoder. With this arrangement, even if the number of memory modules is increased, it can be prevented that loads on an output unit of the controller increase to an undesirable level. Therefore, even if the number of memory modules is increased to achieve a large capacity, the driving capacity of the output unit of the controller does not need to be increased, so that the controller does not need to be redesigned.

A reset control unit is provided which can reset plural memory modules at a different timing for each of the memory modules in accordance with indications from the controller. With this arrangement, since the memory modules are successively reset at a different timing for each of the memory modules or nonvolatile memories, current caused by the resets is dispersed over time, with the result that current caused by the resets of the memory modules can be prevented from concentrating. Therefore, a large current caused by a reset operation of a nonvolatile memory can be relaxed.

A memory control unit is provided which enables write interleave in a manner that transfers write data to a first nonvolatile memory in the above described plural nonvolatile memories, and transfers the next write data to a second nonvolatile memory different from the first nonvolatile memory while the write data is being written to the first nonvolatile memory, with increased data writing performance.

What is claimed is:

1. A nonvolatile memory system, comprising:

one or more memory modules each including a first control logic and one or more nonvolatile memories;

a controller for controlling at least one operation of each of the memory modules according to external access requests and for outputting a selection signal; and a module selecting decoder that generates a module enable signal for selectively enabling at least one of the memory modules by decoding a first portion of the selection signal outputted from the controller, wherein in a memory module not enabled by the module enable signal, a corresponding first control logic prevents at least one operation signal sent from the controller for activating said at least one operation from entering into the nonvolatile memories therein.

2. The nonvolatile memory system according to claim 1, wherein the memory modules each further includes:

a nonvolatile memory selecting decoder for decoding a second portion of the selection signal outputted from the controller thereby generating an output signal; and a second control logic that forms a nonvolatile memory selection signal for selectively enabling at least one of the nonvolatile memories, based on an output enable signal of the controller and the output signal of the nonvolatile memory selecting decoder.

3. The nonvolatile memory system according to claim 1, further comprising a reset control unit that selectively and sequentially resets at least two of the memory modules in accordance with a reset signal from the controller.

4. The nonvolatile memory system according to claim 1, further comprising a reset control unit that selectively and sequentially resets at least two of the memory modules so as to reset each of the nonvolatile memories therein in accordance with a reset signal from the controller.

5. The nonvolatile memory system according to claim 3, wherein the reset control unit includes information holding means having an output terminal corresponding to an input terminal for transmitting the reset signal from the controller to each of the memory modules, and wherein the reset signal is successively negated by a updating signal from the controller to the information holding means.

6. The nonvolatile memory system according to claim 5, wherein the controller comprises:

a memory control unit that enables write interleave concurrently with write operations into at least two of the plural nonvolatile memories, transfers write data to other nonvolatile memories; and a micro processing unit for controlling the operation of the entire controller.

7. The nonvolatile memory system according to claim 1, wherein the first control logic includes a corresponding logic gate for each said at least one operation signal.

8. The nonvolatile memory system according to claim 7, wherein the corresponding logic gate is a OR gate.

9. The nonvolatile memory system according to claim 1, wherein said at least one operation signal is one of a commend data signal, an output enable signal, a write enable signal and a serial clock signal.

10. The nonvolatile memory system according to claim 2, wherein the second control logic is a transceiver for controlling data transfer directions between the controller and the corresponding memory module.

11. The nonvolatile memory system according to claim 10, wherein the transceiver includes a pair of tri-state buffers and a pair of logic gates.

12. The nonvolatile memory system according to claim 5, wherein the information holding means includes a flip-flop circuit.

13. The nonvolatile memory system according to claim 5, wherein the information holding means includes a shift register.

* * * * *